(12) United States Patent
Uchida et al.

(10) Patent No.: US 6,414,263 B1
(45) Date of Patent: Jul. 2, 2002

(54) PROCESSING METHOD OF PRINTED WIRING BOARD

(75) Inventors: Yuichi Uchida, Osaka; Masao Kubo, Nara; Kenichiro Tanaka, Osaka; Isamu Miyamoto, 1-12, Yonbancho, Koshien, Nishinomiya-shi, Osaka, all of (JP)

(73) Assignees: Matsushita Electric Works, Ltd., Kodoma; Isamu Miyamoto, Nishinomiya, both of (JP)

( * ) Notice: Subject to any disclaimer, the term of this patent is extended or adjusted under 35 U.S.C. 154(b) by 115 days.

(21) Appl. No.: 09/627,308

(22) Filed: Jul. 27, 2000

(30) Foreign Application Priority Data

Jul. 27, 1999 (JP) .............................. 11-211445
May 15, 2000 (JP) ...................... 2000-142410

(51) Int. Cl.⁷ .............................................. B23K 26/00
(52) U.S. Cl. ................................................. 219/121.71
(58) Field of Search ...................... 219/121.6, 121.61, 219/121.62, 121.67, 121.7, 121.71, 121.72, 121.85

(56) References Cited

U.S. PATENT DOCUMENTS 5,319,183 A * 6/1994 Hosoya et al. ......... 219/121.68
5,494,781 A * 2/1996 Ohtani et al. ................ 430/311
5,886,877 A * 3/1999 Shingai et al. ............... 174/255

FOREIGN PATENT DOCUMENTS

JP 10-85976 4/1998
JP 10-322034 12/1998

* cited by examiner

Primary Examiner—Samuel M. Heinrich
(74) Attorney, Agent, or Firm—Oblon, Spivak, McClelland, Maier & Neustadt, P.C.

(57) ABSTRACT

To form a hole for electrically connecting an upper conductor layer 11 of an insulating layer 10 of a printed wiring board 1 and a lower conductor layer 12 of the insulating layer 10 in the insulating layer 10 to expose the lower conductor layer 12 to the hole bottom, when laser processing is executed for making the hole 13 in the insulating layer 10 using the printed wiring board 1 comprising a treatment layer 14 being placed between the lower conductor layer 12 and the insulating layer 10 for emitting an electromagnetic wave having a wavelength different from the wavelength of processing laser during the laser processing, change in a signal emitted from the treatment layer 14 of the printed wiring board 1 is measured to determine the remaining state of the insulating layer 10. The electromagnetic wave emitted in laser processing from the treatment layer 14 placed between the lower conductor layer 12 and the insulating layer 10 rather than the reflection of laser of laser is used, so that the hole 13 piercing the insulating layer can be detected precisely.

25 Claims, 9 Drawing Sheets

PROCESSING METHOD OF PRINTED WIRING BOARD

BACKGROUND OF INVENTION

1. Field of Invention

This invention relates to a processing method of a printed wiring board and in particular to a processing method for VIA hole processing in a multilayer wiring board.

2. Related Art

In order to form a hole (VIA hole) for electrically connecting conductor layers above and below the insulating layer of a printed wiring board in the insulating layer by laser processing so as to expose the lower conductor layer to the hole bottom, the hole must be made only in the insulating layer and the residue of the insulating layer must not be left on the lower conductor layer.

Unexamined Japanese Patent Publication Hei. 10-322034 discloses that a substance whose color is changed or which emits light by ultraviolet rays or electron rays is added to and mixed with an insulating layer, ultraviolet rays or electron rays are applied to a hole bottom after hole processing and chemical etching, and whether or not the hole processing condition is judged from the light emission area of the hole bottom face. In this case, however, whether or not the hole bottom reaches the lower conductor layer during laser processing cannot be detected.

On the other hand, JP-A-10-85976 discloses that the reflectivity factor difference between an insulating layer and a lower conductor layer is used to measure the reflection of laser strength of laser, thereby detecting a hole bottom reaching the lower conductor layer. In this case, the hole bottom reaching the lower conductor layer can be detected during laser processing, so that processing laser is controlled based on the detection result, whereby an appropriate hole can be made only in the insulating layer. It also discloses that laser is additionally applied for removing the residue of resin on the surface of lower conductor layer because the reflectivity and thermal conductivity of the lower conductor layer are high and thus the temperature of the resin on the surface of lower conductor layer surface resin does not rise.

However, since the reflection of laser of laser has a high directivity, the detection direction of the reflection of laser is limited and in addition, the detection direction of the reflected laser is affected by the roughness and inclination of the hole bottom face and to use the same material as the lower conductor layer for the upper conductor layer of the insulating layer, it is difficult to carry out inspection with accuracy.

SUMMARY OF INVENTION

It is therefore an object of the invention to provide a processing method of a printed wiring board capable of precisely and easily detecting a hole drilling an insulating layer.

To the end, according to the invention, there is provided a processing method of a printed wiring board wherein in order to produce a hole for electrically connecting an upper conductor layer of an insulating layer of a printed wiring board and a lower conductor layer of the insulating layer into the insulating layer so as to expose the lower conductor layer to a hole bottom, when laser processing is executed for forming the hole in the insulating layer using the printed wiring board, comprising a treatment layer, being placed between the lower conductor layer and the insulating layer, for emitting an electromagnetic wave having a wavelength different from that of processing laser during the laser processing, change in a signal emitted from the treatment layer of the printed wiring board is measured to determine the remaining state of the insulating layer. The electromagnetic wave emitted due to laser processing from the treatment layer placed between the lower conductor layer and the insulating layer rather than the reflection of laser of laser is used, so that the hole drilling the insulating layer can be detected precisely.

As the treatment layer, preferably the printed wiring board can comprise a treatment layer provided by oxidizing a surface of the lower conductor layer, a treatment layer provided by placing a conductive material for emitting an electromagnetic wave by laser processing on a surface of the lower conductor layer, a treatment layer provided by placing a resin containing a component having a strong strength of emitting an electromagnetic wave by laser processing on a surface of the lower conductor layer, or the like.

Inspection illumination may be applied to the hole and at the same time as signal change of the electromagnetic wave emitted from the treatment layer during the laser processing is detected, the strength of the reflection of laser from the lower conductor layer or the emitted light from the treatment layer may be measured to determine the remaining state of the insulating layer.

The printed wiring board may comprise a resin for shielding the electromagnetic wave emitted from the treatment layer as the insulating layer.

To determine the remaining resin thickness on the lower conductor layer, the peak strength of the electromagnetic wave emitted from the treatment layer during the laser processing can be measured and the measured peak strength can be compared with a preset reference value, thereby detecting the remaining resin thickness on the lower conductor layer; the remaining resin thickness on the lower conductor layer can be detected based on the fact that the peak strength of the electromagnetic wave emitted from the treatment layer exceeds a preset upper limit reference value and then is decreased and falls below a preset lower limit reference value; the reflection of laser of processing laser is measured at the same time as the electromagnetic wave emitted from the treatment layer is measured, and the remaining resin thickness on the lower conductor layer can be detected based on the fact that the reflection of laser strength of laser becomes equal to or greater than a reference value of laser reflection and that the electromagnetic wave strength becomes equal to or less than an emission strength reference value; the remaining resin thickness on the lower conductor layer can be detected based on the fact that the signal waveform of the electromagnetic wave emitted from the treatment layer is attenuated before the termination of laser irradiation and a peak is detected; or the remaining resin thickness on the lower conductor layer can be detected by measuring the strength of the electromagnetic wave emitted from the treatment layer, calculating the integration value of the emission strength for each hole, and comparing the integration value with a preset reference value. However, the invention is not limited to the methods.

Preferably, only the electromagnetic waves having a wavelength ranging from 500 nm to 2000 nm, of those emitted from the treatment layer during laser processing are measured; however, any other wavelength band may be adopted depending on the electromagnetic wave emitted from the treatment layer.

Further, preferably the thickness of the treatment layer is set equal to or less than the thickness of the resin that can be removed by executing chemical etching of a next process and when a signal of the electromagnetic wave emitted from the treatment layer is measured, the laser processing is stopped.

Preferably, as the treatment layer, a treatment layer with the emission strength of the electromagnetic wave emitted during the laser processing being twice or more as large as that of the electromagnetic wave emitted by the insulating layer during the laser processing of the insulating layer is used. In this case, the emission strength on a specific wavelength may be twice or more as large as that on the specific wavelength of the electromagnetic wave emitted from the insulating layer.

An electromagnetic wave may be measured on the wavelength at which the maximum strength of the electromagnetic wave emitted by the treatment layer during the laser processing thereof is provided and may be measured on the wavelength at which the strength of the electromagnetic wave emitted by the treatment layer during the laser processing thereof is small and the strength of the electromagnetic wave emitted by the insulating layer during the laser processing thereof is large and the remaining state of the insulating layer may be determined from the electromagnetic wave strength on both the wavelengths, or the electromagnetic wave emitted by the treatment layer during the laser processing thereof may be measured on a plurality of wavelengths and the remaining state of the insulating layer may be determined from the peak strength ratio on the wavelengths.

To thus detect the electromagnetic waves of a plurality of wavelengths, preferably the electromagnetic wave emitted during the laser processing is split by a spectroscope and the post-split electromagnetic waves are detected using two or more detectors.

If a dichroic mirror is placed between a lens for condensing processing laser to a processing position and the printed wiring board and the electromagnetic wave emitted during the laser processing is taken out by the dichroic mirror to the outside of the optical axis of laser and is guided into a detector, the electromagnetic wave can be detected without the effect of the material of the lens.

At this time, if a photosensor array is used as the detector or the condensing lens is placed between the dichroic mirror and the detector, an extremely preferred result can be provided when laser the process is executed in laser beam scanning.

To execute laser processing for making a hole in an insulating layer, change in a signal emitted from the treatment layer of the printed wiring board may be measured to determine the remaining state of the insulating layer and when the remaining thickness of the insulating layer is larger than a setup value, an additional pulse of processing laser may be applied.

BRIEF DESCRIPTION OF THE DRAWINGS

In the accompanying drawings:

FIG. 7A is a schematic representation of the first shot of laser; FIG. 7B is a schematic representation of the second shot of laser; and FIG. 7C is a schematic representation of the third shot of laser;

FIG. 8A is a schematic representation of the first shot of laser; FIG. 8B is a schematic representation of the second shot of laser; FIG. 8C is a schematic representation of the third shot of laser; and FIG. 8D is a schematic representation of the determination operation based on a cumulative integration value;

FIG. 9A is an emission strength-wavelength characteristic chart from the insulating layer; FIG. 9B is an emission strength-wavelength characteristic chart when a part of a hole reaches a treatment layer; and FIG. 9C is an emission strength-wavelength characteristic chart from the treatment layer;

DETAILED DESCRIPTION OF PREFERRED EMBODIMENTS

Figure 2:
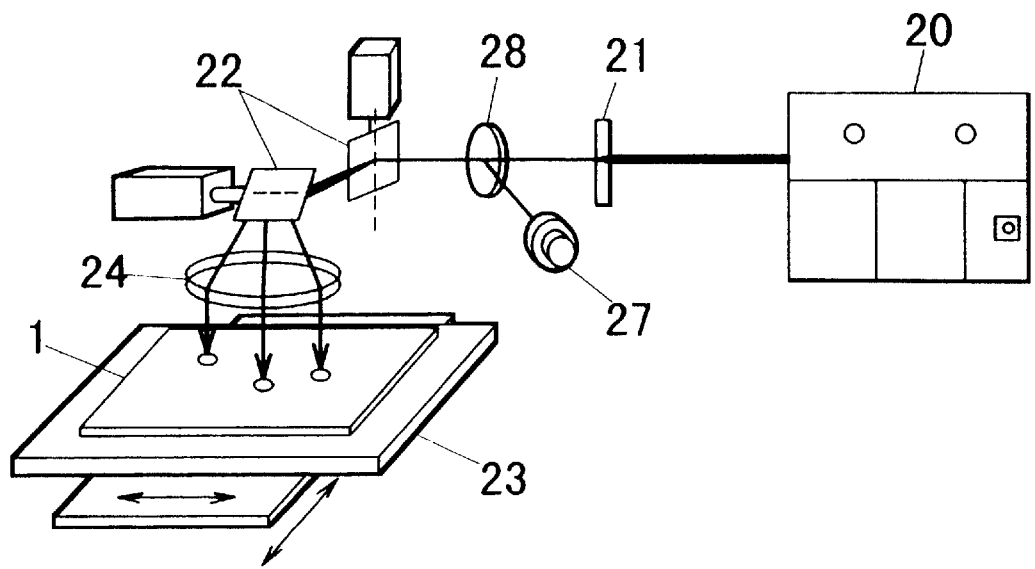
FIG. 2 is a schematic representation of a processing apparatus in the example of the embodiment of the invention.

Referring now to the accompanying drawing, there are shown embodiments of the invention. In the invention, in order to form a hole for electrically connecting an upper conductor layer 11 of an insulating layer 10 of a printed wiring board 1 and a lower conductor layer 12 of the insulating layer 10 into conduction in the insulating layer 10 so as to expose the lower conductor layer 12 to the hole bottom, when laser processing is executed for forming the hole 13 in the insulating layer 10 using the printed wiring board 1 comprising a treatment layer 14 placed between the lower conductor layer 12 and the insulating layer 10 for emitting an electromagnetic wave having a wavelength different from the wavelength of processing laser during the laser processing, change in a signal emitted from the treatment layer 14 of the printed wiring board 1 is measured to determine the remaining state of the insulating layer 10. FIG. 2 shows an example of a processing apparatus for laser processing. Mask 21 is projected on the printed wiring board 1 by laser, thereby making a hole. A galvanometric mirror 22 is used so that laser can be scanned to speed up processing, and further a move with an X-Y table 23 can also be made. In the figure, numeral 24 denotes an f-θ lens.

To process the hole 13 for interlayer conduction of the printed wiring board 1 in the system, the hole 13 is formed in the insulating layer 10 by removal processing by laser irradiation and when the hole bottom of the hole 13 arrives at the surface of the lower conductor layer 12, the laser processing is stopped. However, with $CO_2$ laser processing, and thermal conductivity of the lower conductor layer 12 are high and thus the temperature of the resin on the surface of lower conductor layer does not rise and the resin is left. Thus, the resin left on the lower conductor layer is removed by further adding one pulse of laser or executing a resin removal step of the following step (chemical etching). In the chemical etching, the removal amount changes depending on the time, the treatment liquid concentration, etc. At this time, if the treatment is conducted for a long time or at a high concentration, the resin on the inner wall of the hole 13 is also removed, affecting the hole 13 shape and a plating failure occurs in a later plating step for providing conduction of the upper conductor layer 11 and the lower conductor layer 12, thus it is necessary to manage the thickness of the resin left on the lower conductor layer during the laser processing.

Thus, the remaining resin thickness is managed by monitoring the laser processing state. In the invention, the printed wiring board 1 used is formed with the treatment layer 14 being placed on the surface of the lower conductor layer 12 (face on the insulating layer 10 side) for emitting a strong electromagnetic wave having a wavelength different from that of processing laser by laser processing. The upper conductor layer 11 is not necessarily required.

Preferably, the treatment layer 14 is high absorptivity for processing laser, for example, $CO_2$ laser and is easy to laser processing and is small in thermal capacity, thermal conductivity, and thermal diffusivity. If the hole processing laser is $CO_2$ laser, the strength of an electromagnetic wave occurring when epoxy-family resin of the insulating layer 10 is very small and therefore if the treatment layer 14 having a strong emission strength of an electromagnetic wave is used and the emission strength of an electromagnetic wave when laser hole processing is performed for the insulating layer 10 and the treatment layer 14 is measured and change of the signal is detected, the state of the hole bottom can be grasped.

At this time, the electromagnetic wave from the treatment layer 14 is emitted isotropically from the treatment layer 14 face, thus it is hard to be affected by the state of the hole bottom (inclination, surface roughness, etc.,), and only a signal from the treatment layer 14 in the hole bottom can be detected. Therefore, it is made possible to make a stable determination.

This determination can be made by previously measuring change of the signal of the processed hole of a good product and comparing the change of the signal with the change of the signal measured in the process. As a detector 27 for measuring the emitted electromagnetic wave, a detector having responsivity equal to or more than the pulse width or output waveform of processing laser is used, whereby an inline inspection can be conducted.

Figure 1:
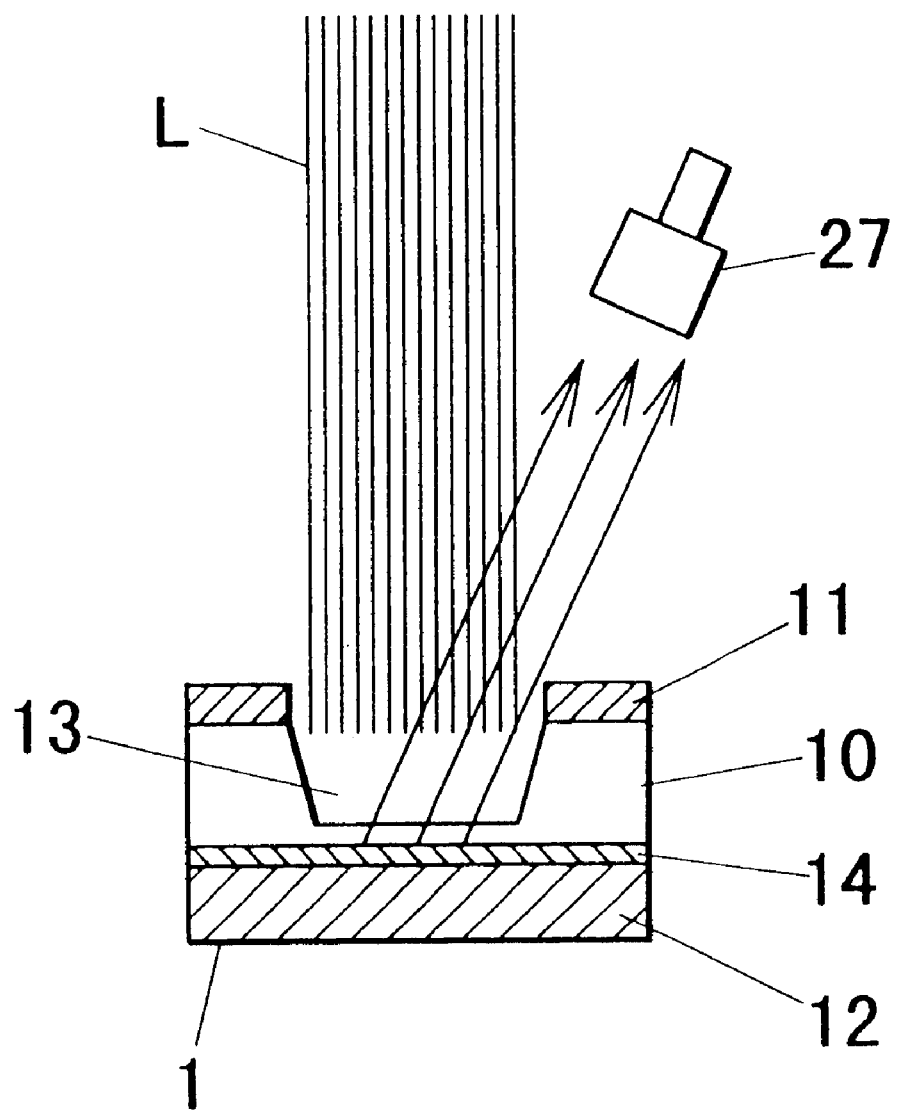
FIG. 1 is a sectional view to show a processing state in one example of an embodiment of the invention.

If the electromagnetic wave to be measured is in the range of ultraviolet light to visible light, a microchannel plate photo multiplayer, etc., can be used as the detector 27; if the electromagnetic wave to be measured has a wavelength ranging from 190 nm to 1100 nm, an Si photodiode can be used as the detector 27; if the electromagnetic wave to be measured has a wavelength ranging from 700 nm to 2600 nm, an InGaAs photodiode can be used as the detector 27; if the electromagnetic wave to be measured is in infrared region, a PbSe photoconductive cell, an InAs photovoltaic element, an InSb photovoltaic element, an MCT photoconductive cell, etc., can also be used as the detector 27 in addition to the above-mentioned devices. Preferably, the detector 27 is placed at a position just above the processed hole where the hole bottom is not hidden on the hole wall face from the position of the detector 27. However, to place the detector 27 just above the processed hole, namely, on the optical axis of processing laser, the processing laser is shut off and processing energy is decreased, thus a beam splitter or a pin hole mirror 28 for taking out the emitted electromagnetic wave from the laser optical axis is installed. Particularly, to process in a system of scan type using a galvanometric mirror, it is made possible to make an inspection for each hole without decreasing the processing speed by detecting coaxially with the laser optical axis. As shown in FIG. 1, the detector 27 may be disposed by the side of the optical axis of beam L.

Various substances can be used as the treatment layer 14 in the printed wiring board 1; preferably, the treatment layer 14 can be provided by oxidizing the surface of the lower conductor layer 12 (black oxide). If the lower conductor layer 12 is copper, a copper surface can be immersed in an NaOH solution as oxidation treatment. When laser processing reaches the treatment layer 14 of the oxidation treatment layer (CuO), the treatment layer 14 absorbs laser and is heated. At this time, copper oxide is high absorptivity of $CO_2$ laser and is large in emission strength of an electromagnetic wave generated upon heating, so that change in the signal detected is increased and it is made possible to make an inspection with high accuracy. As the detector 27 used for measurement, an appropriate one may be selected depending on the wavelength of the electromagnetic wave generated during the laser processing. This topic will be discussed later.

If the relationship between the strength change of the electromagnetic wave generated during the laser processing and the thickness of the resin left on the lower conductor layer is previously determined and the signal for providing a good product is found, it is made possible to make an inspection at the same time as processing by comparing with the signal change. If the treatment layer 14 is black oxide, it can also be expected that the adhesion of the insulating layer 10 and the lower conductor layer 12 to each other will be provided because the copper surface is made coarse in black oxide.

The treatment layer 14 may be provided by placing a conductive material for emitting an electromagnetic wave by laser processing, for example, carbon on the surface of the lower conductor layer 12. The treatment layer 14 (carbon layer) can be provided by vacuum evaporation, vacuum sputtering, etc., by heating a carbon material. In this case, when laser processing reaches the treatment layer 14 as the hole bottom, the treatment layer 14 of the carbon layer is high absorptivity of $CO_2$ laser and is large in emission strength of an electromagnetic wave generated upon heating, so that change in the signal detected is increased and an inspection can be made with high accuracy.

Further, the treatment layer 14 may be provided by placing a resin layer containing a component having a strong strength of emitting an electromagnetic wave by laser processing between the insulating layer 10 and the lower conductor layer 12. For example, in the printed wiring board 1 in which a predetermined insulating layer 10 is formed after an epoxy-family resin to which carbon powder is mixed is applied onto the lower conductor layer 12 to form the treatment layer 14, when laser processing reaches the treatment layer 14 as the hole bottom, the change in the signal detected is increased and it is made possible to make an inspection with high accuracy, because carbon has a large emission strength of an electromagnetic wave which is generated when carbon absorbs laser to be heated. In this case, the treatment layer 14 may be based on a normal insulating material and therefore an adhesion failure, etc., can be made hard to occur.

Figure 3:
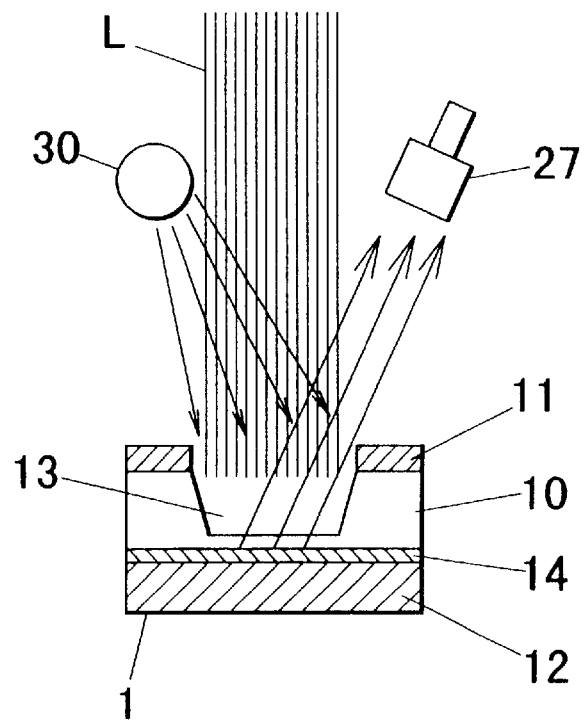
FIG. 3 is a sectional view to show a processing state in another example of the embodiment of the invention.

At the same time as the signal change of the electromagnetic wave emitted from the treatment layer 14 is measured, as shown in FIG. 3, inspection illumination 30 may be applied to the hole 13 and the strength of the reflection of laser from the lower conductor layer or the emitted light from the treatment layer 14 may also be measured with the detector 27. The inspection accuracy can be enhanced by aggressively detecting a signal from the treatment layer 14 using the inspection light source 30 rather than detecting only a signal from the treatment layer 14 generated during the laser processing. At the time, the detector 27 of the electromagnetic wave emitted from the treatment layer 14 need not be identical with the detector for measuring the reflection of laser of the inspection light source 30. To use the treatment layer producing fluorescence upon irradiation of ultraviolet rays as the treatment layer 14, ultraviolet light may be used as the inspection light source 30 and the fluorescence strength may be measured.

If the insulating layer 10 is formed of a resin into which a material capable of shielding the electromagnetic wave emitted from the treatment layer 14 is mixed, when the insulating layer is removed and the treatment layer 14 is exposed, the signal change is increased, so that the-removal state of the insulating layer can be grasped precisely and it is made possible to make an inspection with high accuracy.

To detect emission of visible light of the electromagnetic wave emitted from the treatment layer 14, a black pigment (for example, superfine particle of composite oxide pigment of Fe, Mn, Cr, Co, Ni, etc. or magnetite powder,) may be mixed into the epoxy-family resin of the insulating layer 10. If the insulating layer 10 is left on the lower conductor layer, even if an electromagnetic wave is reflected from the treatment layer 14 as a result of laser passing through the insulating layer 10 and reaching the treatment layer 14, the insulating layer 10 into which the black pigment is mixed shields the electromagnetic wave. Thus, it becomes clear that the remaining resin exists on the lower conductor layer.

Figure 4:
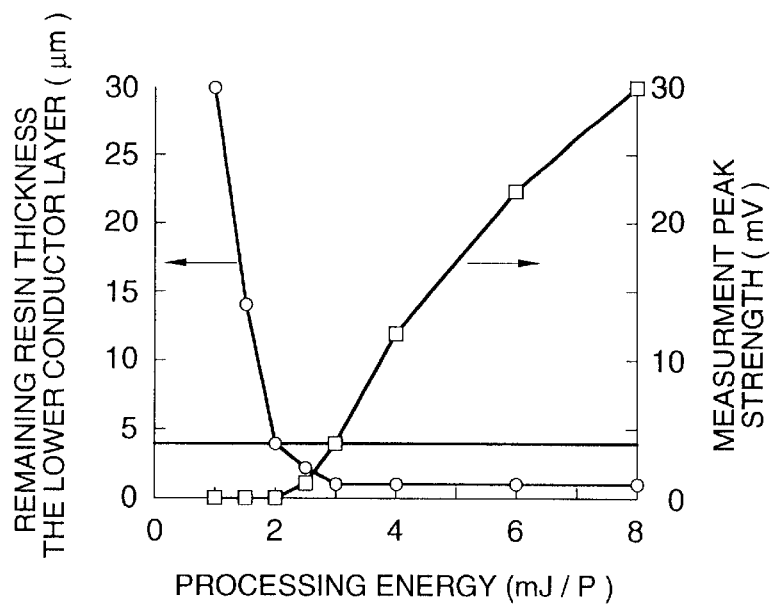
FIG. 4 is a schematic representation of determination operation.

To determine the remaining state of the insulating layer 10 on the lower conductor layer based on the signal change of the electromagnetic wave emitted from the treatment layer 14, as shown in FIG. 4, the peak strength of the electromagnetic wave emitted from the treatment layer 14 during the laser processing can be measured and the measured peak strength can be compared with a preset reference value. The thinner the remaining resin thickness on the lower conductor layer, the larger the energy input to the treatment layer 14 and the larger the change in the electromagnetic wave emitted during the laser processing. Since the peak strength of the electromagnetic wave emitted from the treatment layer 14 is measured, the determination process can be executed by a simple comparison circuit, the inspection algorithm can be simplified, and the processing time can be shortened.

Now, assuming that the insulating layer of the epoxy-family resin of the insulating layer 10 is 60 $\mu$m thick, that a treatment layer provided by oxidizing the copper surface black oxide is used as the treatment layer 14, and that the processed hole diameter is $\phi$100 $\mu$m, when the remaining resin thickness on the lower conductor layer is 4 $\mu$m or more, the signal strength change is small and a peak is little measured on the waveform. However, if the measurement peak strength is one reference value or more, the remaining resin thickness on the lower conductor layer is about 1 $\mu$m or less. Therefore, when the remaining resin thickness on the lower conductor layer becomes equal to or less than a predetermined thickness of the resin that can be removed by executing chemical etching at a next process, the signal strength peak value is previously measured and a comparison with the value is made, whereby the remaining resin thickness can be detected. The above-mentioned reference value changes depending on the material to be processed, the laser processing condition, etc., and thus it is necessary to set a reference value in each condition.

Figure 5:
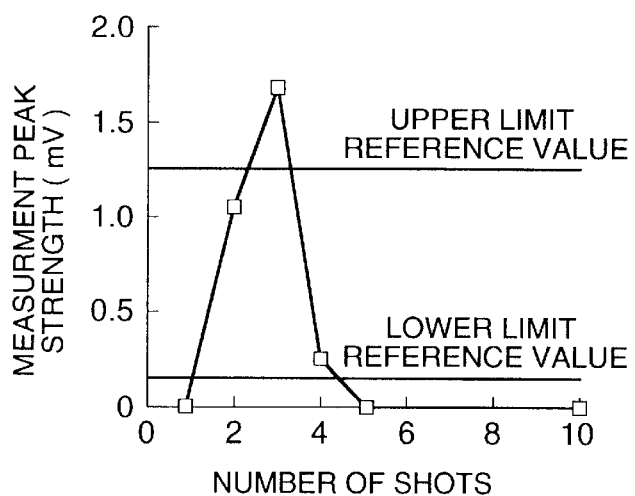
FIG. 5 is a schematic representation of another determination operation.

As shown in FIG. 5, it may be determined that the remaining resin thickness on the lower conductor layer becomes equal to or less than the allowable thickness based on the fact that the peak strength of the electromagnetic wave emitted during laser processing exceeds a preset upper limit reference value and then is decreased and falls below a preset lower limit reference value.

This topic will be discussed. The thinner the remaining resin thickness on the lower conductor layer, the larger the energy input to the treatment layer and the larger the change in the electromagnetic wave emitted during the laser processing. As processing is further advanced and the treatment layer 14 generating an electromagnetic wave is dissolved and removed by the laser processing, the measured signal is decreased. Here, if the laser processing energy is too low to form a hole to the hole bottom by one shot of processing, laser is applied at two or more times for processing. At this time, the strength of the measured electromagnetic wave changes every shot, but the signal peak strength is comparatively small. Therefore, if a determination is made only by the level of the signal peak strength, it becomes difficult to maintain inspection accuracy. Then, the remaining resin state on the lower conductor layer is determined by the fact that the signal peak strength exceeds the upper limit reference value and then falls below the lower limit reference value.

The signal peak value exceeds the upper limit reference value, which indicates that the hole bottom reaches the treatment layer 14. Then, the signal peak value is decreased, which indicates that sufficient laser energy is input to the treatment layer 14 generating an electromagnetic wave. Consequently, the remaining resin thickness on the lower conductor layer can be detected being equal to or less than a predetermined thickness of the resin that can be removed by executing chemical etching at a next process.

Now, assuming that the insulating layer of the epoxy-family resin of the insulating layer 10 is 60 $\mu$m thick, that a treatment layer provided by oxidizing the copper surface (black oxide) is used as the treatment layer 14, that laser processing energy is 1.7 mJ/p, and that the processed hole diameter is $\phi$100 $\mu$m, the hole cannot form to lower conductor layer by one shot of processing, the signal change is small, and a peak is not measured on the waveform. When hole processing reaches the hole bottom on additional shots of processing and the signal strength peak value is once increased and then is decreased and is not measured. Upper and lower limit reference values of the peak value in a good hole are preset. The upper limit reference value is found from the maximum value of the peak strength when additional shots are executed, and the lower limit reference value is found from the minimum value of the peak strength after the upper limit reference value is measured. The values are compared with the measurement peak value during processing, whereby it is made possible to detect the remaining resin thickness on the lower conductor layer. The above-mentioned reference values change depending on the material to be processed, the laser processing condition, etc., and thus are set based on the conditions.

Figure 6:
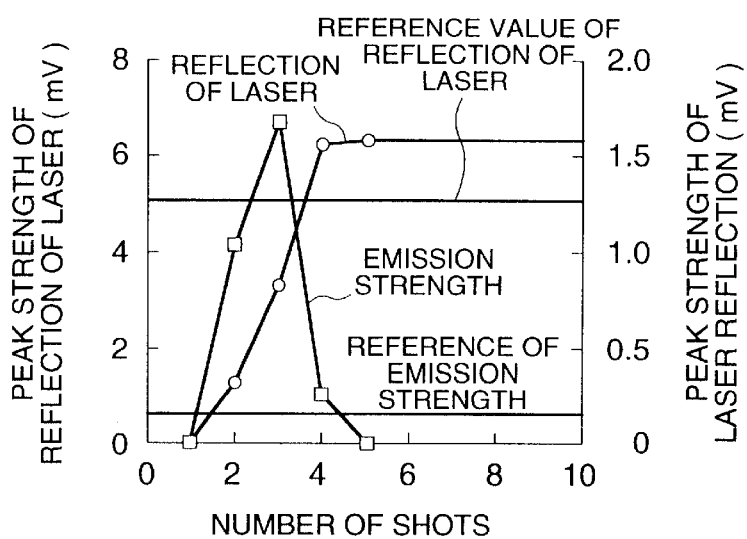
FIG. 6 is a schematic representation of still another determination operation.

As shown in FIG. 6, reflection of laser of laser may also be measured at the same time as the electromagnetic wave emitted from the treatment layer 14 is measured, and a determination may be made based on the fact that the reflection of laser strength becomes equal to or greater than a reference value of laser reflection and that the electromagnetic wave strength becomes equal to or less than an emission strength reference value. The thinner the remaining resin thickness on the lower conductor layer, the larger the energy input to the treatment layer 14 and the higher the strength of the electromagnetic wave emitted from the treatment layer 14. As processing is further advanced and the treatment layer 14 is dissolved and removed by the laser processing, the measured signal is decreased. At this time, if the upper limit reference value is used to make a determination, it is possible that the signal peak strength is measured as if it exceeded the upper limit reference value because of noise. Thus, here, whether or not the strength of the reflection of processing laser exceeds the reflection of laser reflection is added to the determination condition in place of the condition as to whether or not the signal peak strength exceeds the upper limit reference value. Change in the peak strength of reflection of laser in a good hole and change in the peak value of the signal waveform emitted from the treatment layer are previously measured, and the above-mentioned reference values are set based on the measurement result.

Figure 7A:
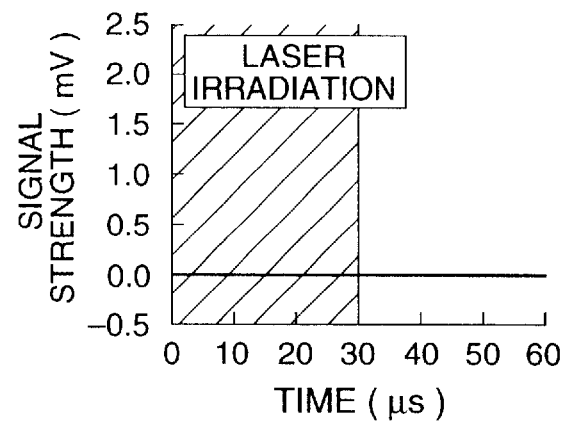
FIGS. 7A to 7C are schematic representations of another determination operation.
Figure 7B:
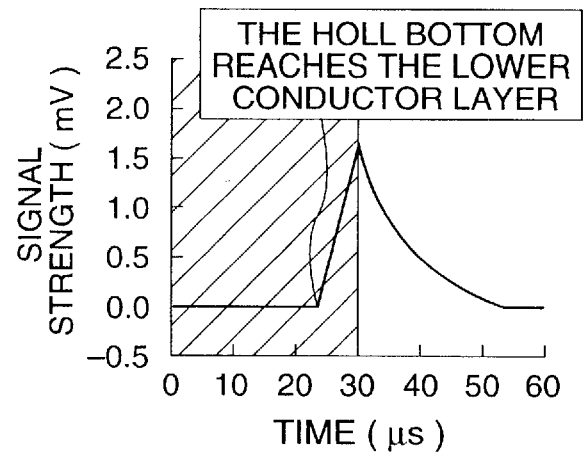
Figure 7C:
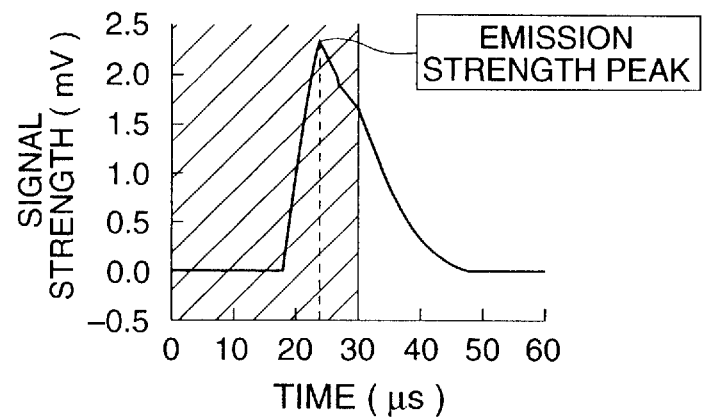

In addition, a determination may be made based on the fact that the electromagnetic wave emitted from the treatment layer 14 during laser processing is measured and the signal waveform is attenuated before the termination of laser irradiation and a peak is detected. As shown in FIGS. 7A to 7C, the signal waveform is detected and the remaining resin state on the lower conductor layer is determined according to the shape. The thinner the remaining resin thickness on the lower conductor layer, the larger the energy input to the treatment layer 14 and the higher the strength of the electromagnetic wave emitted during the laser processing. As processing is further advanced and the treatment layer 14 generating an electromagnetic wave is dissolved and removed by the laser processing, the measured signal is decreased. Here, if the waveform about the strength of the electromagnetic wave at the time is attenuated until the termination of laser irradiation and a peak is detected, the treatment layer 14 is sufficiently heated and the maximum remaining resin thickness on the lower conductor layer becomes about 1 $\mu$m. If the remaining resin state on the lower conductor layer is thus determined by the waveform of the signal, when a peak is detected on the waveform, the laser application is stopped and an optimum hole shape can be stably provided without inputting extra processing energy.

For example, assuming that the insulating layer of the epoxy-family resin of the insulating layer 10 is 60 $\mu$m thick, that a treatment layer provided by oxidizing the copper surface (black oxide) is used as the treatment layer 14, that laser processing energy is 1.7 mJ/p, that the pulse width is 30 $\mu$s, and that the processed hole diameter is $\phi$100 $\mu$m, the hole cannot form to the lower conductor layer on the first laser pulse (first shot, FIG. 7A) and the hole reaches the treatment layer 14 on the second shot (FIG. 7B), but an appropriate hole shape cannot be provided because resin is left on the lower conductor layer and the exposed hole bottom diameter is small. On the third shot of processing (FIG. 7C), a peak is observed during the laser irradiation and the maximum resin thickness left on the lower conductor layer becomes about 1 $\mu$m; a good processed hole can be provided. Since a determination is made by the waveform of the signal, it is not necessary to preset reference values used for the determination.

Figure 8A:
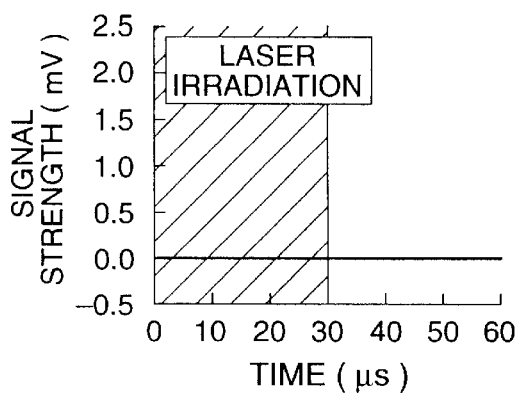
FIGS. 8A to 8D are schematic representations of still another determination operation.
Figure 8B:
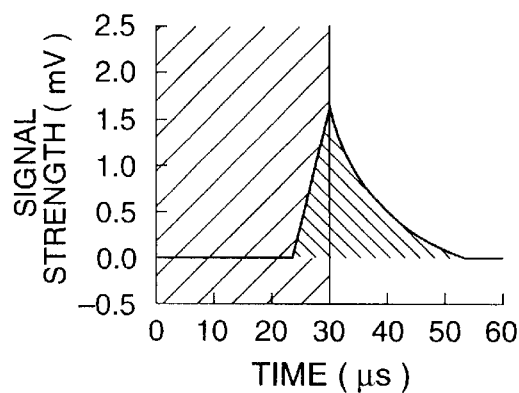
Figure 8C:
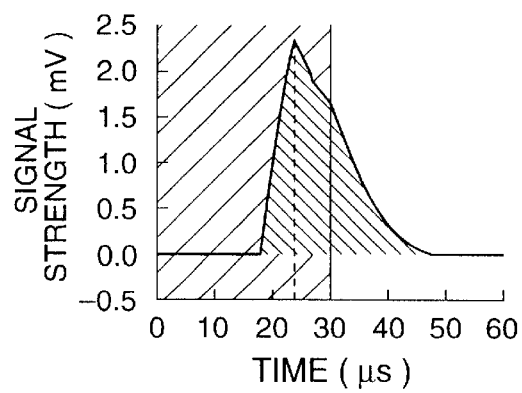
Figure 8D:
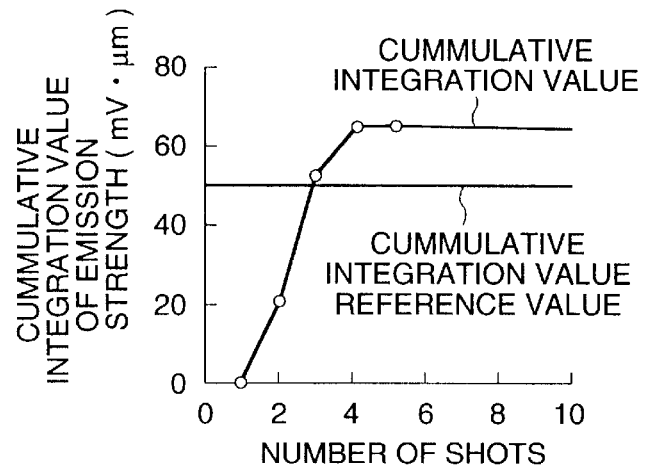

As shown in FIGS. 8A to 8D, a determination can also be made by measuring the strength of the electromagnetic wave emitted from the treatment layer 14 during the laser processing, calculating the integration value of the emission strength for each hole, and checking whether or not the integration value reaches a preset reference value. FIG. 8A shows time change of the emission strength on the first shot, FIG. 8B shows that on the second shot, and FIG. 8C shows that on the third shot. The waveform area (hatched portion in the figure) is found as the emission strength integration and a determination can also be made by accumulating the integration value of the emission strength for each hole starting at the first shot and checking whether or not the cumulative integration value reaches a preset reference value, as shown in FIG. 8D.

The amount of emitting the electromagnetic wave from the treatment layer is constant if the hole bottom diameters are the same. On the other hand, to form a hole on a plurality of shots, the emission strength varies from one hole to another, from one shot to another in measurement. Therefore, as compared with the case where the remaining resin state on the lower conductor layer is determined by the peak value of the signal on one'th shot, if the remaining resin thickness on the lower conductor layer is detected by performing integration operation on the emission waveforms and comparing the result with a previously calculated integration reference value of a good product, the reliability of inspection accuracy is enhanced. Of course, the above-mentioned reference values change depending on the material to be processed, the laser processing condition, etc., and thus are set based on the conditions.

By the way, to measure the electromagnetic wave emitted from the treatment layer 14, preferably the electromagnetic wave having a wavelength ranging from 500 nm to 2000 nm is measured. In particular, if the treatment layer 14 is provided by oxidizing subjecting copper of the lower conductor layer 12 (black oxide), the emission strength of the electromagnetic wave emitted from the treatment layer 14 by $CO_2$ laser processing becomes high in the wavelength region of 500 to 2000 nm and it is made possible to remove external noise, etc., for example, by passing through a filter so that the detector 27 can detect only the above-mentioned wavelength region; the accuracy of detecting the remaining resin thickness can be raised.

To use the treatment layer 14 provided by placing a conductive material for emitting an electromagnetic wave by laser processing on the surface of the lower conductor layer 12 or the treatment layer 14 provided by placing a resin containing a component having a strong strength of emitting an electromagnetic wave by laser processing on the surface of the lower conductor layer 12, if copper sulfide is used in addition the above-mentioned carbon, near-infrared light having a wavelength ranging from 500 nm to 2000 nm is also emitted, so that a highly accurate determination can be made by measuring the electromagnetic wave only in the wavelength region.

Preferably, the thickness of the treatment layer 14 is set equal to or less than a thickness of the resin that can be removed by executing chemical etching of a next process of laser processing. Particularly, to use a resin containing a component having a strong strength of emitting an electromagnetic wave by laser processing as the treatment layer 14 for emitting an electromagnetic wave, if laser hole processing is executed, change in the emission strength is not measured unless the treatment layer 14 on the lower conductor layer is reached. As the processing is further advanced and processing the treatment layer 14 is started, change in the emission strength is measured. Therefore, if change in the emission strength is measured, it means that the insulating layer is removed and only the treatment layer 14 is left on the lower conductor layer. The resin of the treatment layer 14 left on the lower conductor layer by laser processing is removed by executing chemical etching of the following step. If the thickness of the treatment layer is set equal to or less than the thickness of the resin that can be removed by executing chemical etching and a signal from the treatment layer 14 is detected by laser processing, it is made possible to determine that the remaining resin thickness on the lower conductor layer is the thickness of the resin that can be removed at a next process. Therefore, the thickness of the treatment layer 14 is set equal to or less than the thickness of the resin that can be removed by executing chemical etching, whereby it is not necessary to previously keep track of the correlation between the signal strength from the treatment layer and the thickness of the insulating layer 10 left on the lower conductor layer, and it is made possible to control the resin left on the lower conductor layer with high accuracy.

If the treatment layer 14 is a conductive material, it need not be removed unless the adhesion to conductor plating at a next process does not involve a problem. However, if the treatment layer 14 is provided by oxidizing the lower conductor layer 12 (copper), the treatment layer 14 is removed by executing chemical etching.

Next, if the insulating layer 10 also emits an electromagnetic wave having strong emission strength during the laser processing because the insulating layer 10 is formed of a composite material containing a glass cloth base material, etc., for example, the following countermeasures may be taken:

A treatment layer 14 of a material adapted to emit an electromagnetic wave having a strength twice or more that of the electromagnetic wave emitted by the insulating layer 10 is used. As such a treatment layer 14, a layer containing an oxidation treatment layer (CuO), a carbon layer, metal powder (Cu, Fe, etc.,) can be used. The strength may be twice or more that of the electromagnetic wave on the wavelength used for determination, and need not be twice or more that of the electromagnetic wave throughout the wavelength region.

Figure 9A:
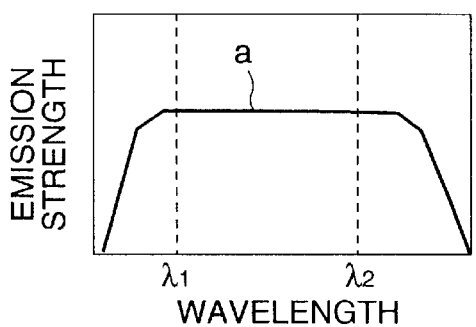
FIGS. 9A to 9C describe the operation in another example.
Figure 9B:
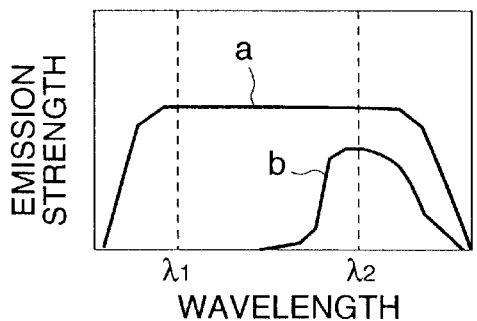
Figure 9C:
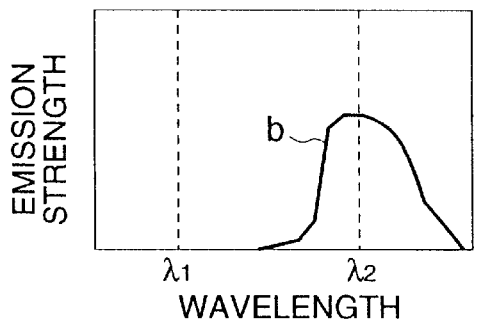

If emitted electromagnetic waves differ in wavelength distribution although the strength of the electromagnetic wave on one wavelength is not twice or more, the following determination can be made by measuring a plurality of wavelengths: If the emission strength of the electromagnetic wave emitted from the insulating layer 10 is a wavelength distribution as shown as a in FIG. 9A and laser processing reaches the treatment layer 14 and the emission strength from the treatment layer 14 is a wavelength distribution as shown as b in FIG. 9B, a determination is made as to two wavelengths of $\lambda 1$ and $\lambda 2$ in the figures. When the emission strengths on both the two wavelengths of $\lambda 1$ and $\lambda 2$ are both in large, it is determined that laser processing of the insulating layer 10 is being executed; when the emission strength on the wavelength $\lambda 1$ is small and the emission strength on the wavelength $\lambda 2$ is large as shown in FIG. 9C, it is determined that laser processing of the treatment layer 14 is being executed. In this case, preferably the emission strength on the wavelength $\lambda 1$ is first measured and when the emission strength on the wavelength $\lambda 1$ lessens, the emission strength on the wavelength $\lambda 2$ is measured and a determination is made from the peak value or progression of the emission strength on the wavelength $\lambda 2$. In this case, the determination can be made with no problem if the emission strength on the wavelength $\lambda 2$ of the electromagnetic wave emitted from the insulating layer 10 is higher than that of the electromagnetic wave emitted from the treatment layer 14.

Figure 10:
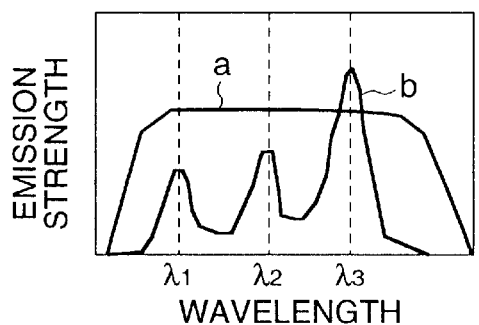
FIG. 10 is an emission strength-wavelength characteristic chart to describe the operation in still another example.

As shown in FIG. 10, measurement on a plurality of wavelengths (in the example shown in the figure, $\lambda 1, \lambda 2$, and $\lambda 3$) is conducted and whether the electromagnetic wave is electromagnetic wave a emitted from the insulating layer 10 or electromagnetic wave b emitted from the treatment layer 14 may be determined from the emitted electromagnetic wave strength ratio on the wavelengths. In the example shown in the figure, if the emission strengths on the three wavelengths $\lambda 1$, $\lambda 2$, and $\lambda 3$ are almost the same, the electromagnetic wave is determined the electromagnetic wave a emitted from the insulating layer 10 and if the emission strength on $\lambda 1$<the emission strength on $\lambda 2$<the emission strength on $\lambda 3$, the electromagnetic wave is determined the electromagnetic wave b emitted from the treatment layer 14.

Thus, even if an electromagnetic wave is also emitted from the insulating layer 10 during the laser processing, the electromagnetic wave emitted from the insulating layer 10 can be discriminated from the electromagnetic wave from the treatment layer 14 in the determination unless the electromagnetic wave emitted from the insulating layer 10 and the electromagnetic wave emitted from the treatment layer 14 are almost the same in two points of the wavelength distribution and the emission strength.

Figure 11:
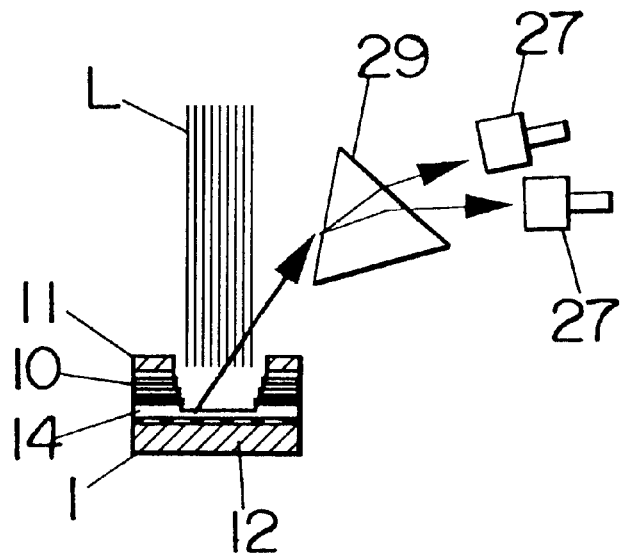
FIG. 11 is a schematic representation of another example.

If it is necessary to measure a plurality of wavelengths for determination, wavelength detectors 27 and 27 different insensible wavelength may be placed behind a spectroscope 29 such as a prism or a diffraction grating as shown in FIG. 11. The detection strength on each wave strength can be made larger than that if the electromagnetic wave is introduced into each detector 27, 27 not via the spectroscope 29.

Figure 12:
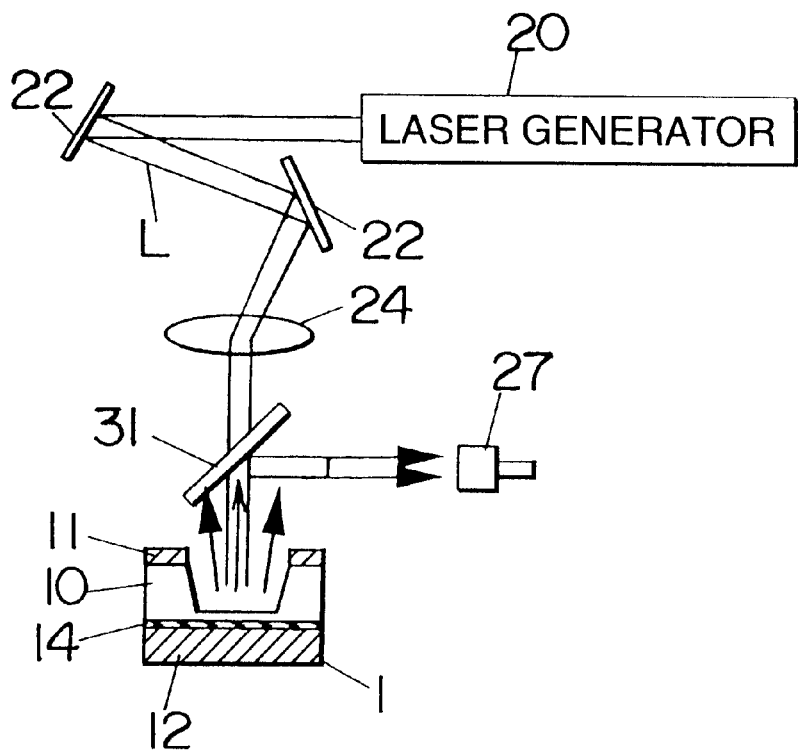
FIG. 12 is a schematic representation of still another example.

FIG. 12 shows another example. To measure an electromagnetic wave by the detector 27 coaxial with processing laser, a dichroic mirror 31 is placed between a lens 24 and a printed wiring board 1 to be processed and the electromagnetic wave to be measured is reflected by the dichroic mirror 31 on the detector 27 side.

Normally, ZnSe is used as a material of the infrared light condensing lens 24 and Ge may be used. The condensing lens 24 made of Ge does not allow near-infrared light to visible light to ultraviolet light having a wavelength of 2 $\mu$m or less to pass through because of the optical characteristic of the Ge lens, thus an electromagnetic wave cannot be monitored through the condensing lens 24. This means that if the dichroic mirror 31, etc., is placed between a laser generator and the condensing lens 24 for introducing an emitted electromagnetic wave into the detector 27, the electromagnetic wave may be unable to be monitored in some cases. However, as described above, the electromagnetic wave emitted from the printed wiring board 1 is taken out to the outside of the axis of laser before it passes through the lens 24, whereby the electromagnetic wave can be measured without the effect of the material of the lens 24.

Figure 13:
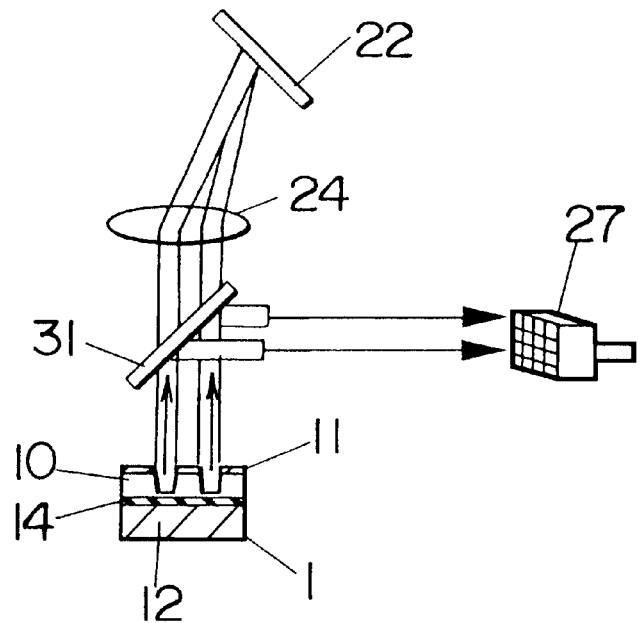
FIG. 13 is a schematic representation of another example in FIG. 12.

At the time, if a photosensor array comprising photosensors arranged like a matrix is used as the detector 27 as shown in FIG. 13, when the processing position is scanned by a galvanomirror 22, the electromagnetic wave can be measured in all processing areas although it is taken out to the outside of the axis before the electromagnetic wave passes through the lens 24.

Figure 14:
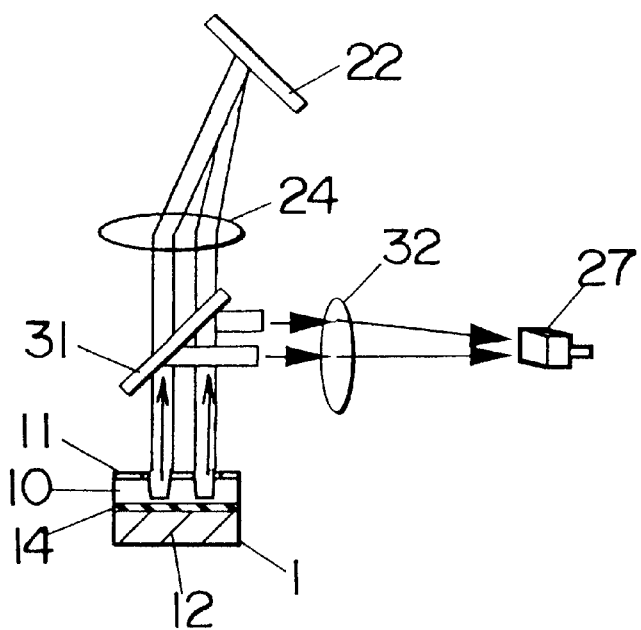
FIG. 14 is a schematic representation of still another example in FIG. 12.

Of course, as shown in FIG. 14, a condensing lens 32 is placed between the dichroic mirror 31 and the detector 27 and a reduced formed image by the condensing lens 32 is introduced into the detector 27, whereby the electromagnetic wave can also be measured in all processing areas if scanning and processing are executed in a similar manner to that described above.

Figure 15:
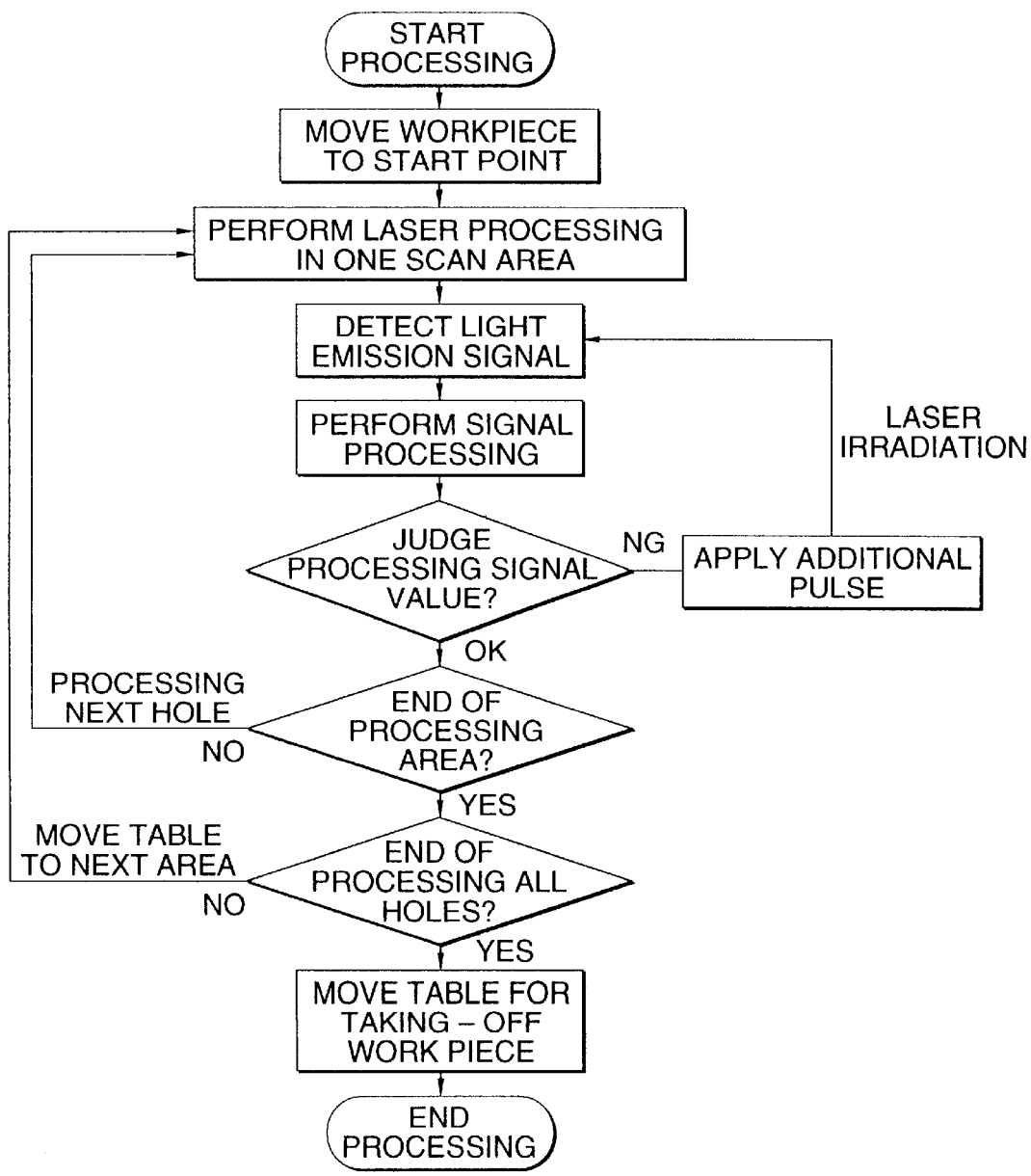
FIG. 15 is a schematic representation of the operation algorithm of laser processing.

FIG. 15 shows a flow chart using the above-described determination to control laser processing. An electromagnetic wave (light emission signal) generated in laser processing from the insulating layer 10 and the treatment layer 14 is detected and if the laser processing does not reach the treatment layer 14, an additional pulse of laser is applied. As the operation is repeated, the thickness of the insulating layer 10 is decreased and if the remaining thickness of the insulating layer 10 becomes equal to or less than a setup value (if the thickness containing the treatment layer 14 becomes equal to or less than the thickness that can be removed by executing chemical etching when the treatment layer 14 is also removed), processing the another hole is started. Upon completion of processing all holes in the area, a processing table is moved for moving to processing in another area. Upon completion of all holes in all areas, a workpiece taking-out table is moved and the workpiece (printed wiring board 1) is taken out.

Since processing is executed until the remaining thickness of the insulating layer 10 becomes reliably thin, failures can be eliminated.

As described above, in the invention, to form a hole for electrically connecting an upper conductor layer of an insulating layer of a printed wiring board and a lower conductor layer of the insulating layer in the insulating layer to expose the lower conductor layer to a hole bottom, when laser processing is executed for forming the hole in the insulating layer using the printed wiring board comprising a treatment layer being placed between the lower conductor layer and the insulating layer for emitting an electromagnetic wave having a wavelength different from that of processing laser during the laser processing, change in a signal emitted from the treatment layer of the printed wiring board is measured to determine the remaining state of the insulating layer. The electromagnetic wave emitted in laser processing from the treatment layer placed between the lower conductor layer and the insulating layer rather than the reflection of laser of laser is used, so that a hole piercing the insulating layer can be detected precisely. Particularly, the electromagnetic wave is emitted isotropically from the hole bottom, thus restrictions on the detection direction of the electromagnetic waves are few, and roughness or inclination of the hole bottom does not cause change in the emission state or emission strength. Further, to use the same material as the lower conductor layer for the upper conductor layer, a determination not affected by the upper conductor layer can also be made.

As the treatment layer, the printed wiring board can comprise a treatment layer provided by oxidizing a surface of the lower conductor layer to oxidation treatment. Since the laser absorptivity is high, a strong signal can be provided and reliability is enhanced and in addition, the adhesion of the insulating layer and the lower conductor layer to each other can be provided.

The printed wiring board may comprise a treatment layer provided by placing a conductive material for emitting an electromagnetic wave by laser processing on a surface of the lower conductor layer. Also in this case, since the laser absorptivity is high, a strong signal can be provided and reliability is enhanced and in addition, continuity reliability can be provided if the treatment layer is left.

When the printed wiring board comprises a treatment layer provided by placing a resin containing a component having a strong strength of emitting an electromagnetic wave by laser processing on a surface of the lower conductor layer, the resin material is limited only a little and the adhesion of the insulating layer and the treatment layer to each other can be provided.

When inspection illumination is applied to the hole and at the same time as signal change of the electromagnetic wave emitted from the treatment layer during the laser processing is detected, the strength of the reflection of laser from the hole bottom or the emitted light from the treatment layer is measured to determine the remaining state of the insulating layer, the reliability of inspection is furthermore enhanced.

If the printed wiring board comprises a resin for shielding the electromagnetic wave emitted from the treatment layer as the insulating layer, the reliability of inspection can also be enhanced.

To determine the remaining resin thickness on the lower conductor layer, if the peak strength of the electromagnetic wave emitted from the treatment layer during the laser processing is measured and the measured peak strength is compared with a preset reference value, thereby detecting the remaining resin thickness on the lower conductor layer, inspection and determination are made easy.

If the remaining resin thickness on the lower conductor layer is detected based on the fact that the peak strength of the electromagnetic wave emitted from the treatment layer exceeds a preset upper limit reference value and then is decreased and falls below a preset lower limit reference value, the reliability of inspection is also improved.

Further, if the reflection of laser is measured at the same time as the electromagnetic wave emitted from the treatment layer is measured, and the remaining resin thickness on the lower conductor layer is detected based on the fact that the reflection of laser strength becomes equal to or greater than a reflection of laser reference value of laser reflection and that the electromagnetic wave strength becomes equal to or less than an emission strength reference value, high reliability can also be provided.

If the remaining resin thickness on the lower conductor layer is detected based on the fact that the signal waveform of the electromagnetic wave emitted from the treatment layer is attenuated before the termination of laser irradiation and a peak is detected or if the remaining resin thickness on the lower conductor layer is detected by measuring the strength of the electromagnetic wave emitted from the treatment layer, calculating the integration value of the emission strength for each hole, and comparing the integration value with a preset reference value, high reliability can also be provided.

Only the electromagnetic waves having a wavelength ranging from 500 nm to 2000 nm, of those emitted from the treatment layer during laser processing are measured, whereby noise can be decreased for enhancing the reliability.

Preferably, the thickness of the treatment layer is set equal to or less than the thickness of the resin that can be removed by executing chemical etching of a next process and when a signal of the electromagnetic wave emitted from the treatment layer is measured, the laser processing is stopped. High reliability can be provided and in addition, it is not necessary to previously keep track of the correlation between the signal strength from the treatment layer and the thickness of the resin left on the lower conductor layer.

As the treatment layer, a treatment layer with the emission strength of the electromagnetic wave emitted during the laser processing being twice or more as large as that of the electromagnetic wave emitted by the insulating layer during the laser processing of the insulating layer is used, whereby the invention can also be applied to the case where the insulating layer is formed of a composite material and an electromagnetic wave is also emitted from the insulating layer during the laser processing.

If the emission strength on a specific wavelength is twice or more as large as that on the specific wavelength of the electromagnetic wave emitted from the insulating layer, the invention can be applied by detecting the specific wavelength, of course.

An electromagnetic wave may be measured on the wavelength at which the maximum strength of the electromagnetic wave emitted by the treatment layer during the laser processing thereof is provided and may be measured on the wavelength at which the strength of the electromagnetic wave emitted by the treatment layer during the laser processing thereof is small and the strength of the electromagnetic wave emitted by the insulating layer during the laser processing thereof is large and the remaining state of the insulating layer may be determined from the electromagnetic wave strength on both the wavelengths, or the electromagnetic wave emitted by the treatment layer during the laser processing thereof may be measured on a plurality of wavelengths and the remaining state of the insulating layer may be determined from the peak strength ratio on the wavelengths. In this case, if the wavelength at which the maximum strength of the electromagnetic wave emitted by the treatment layer during the laser processing thereof overlaps the wavelength region of the electromagnetic waves emitted from the insulating layer, the electromagnetic wave emitted from the insulating layer can be discriminated from that from the treatment layer in the determination In any way, to detect the electromagnetic waves of a plurality of wavelengths, if the electromagnetic wave emitted during the laser processing is split by a spectroscope and the post-split electromagnetic waves are detected using two or more detectors, the detection strength on each wavelength can be enlarged for enhancing the inspection accuracy.

If a dichroic mirror is placed between a lens and the printed wiring board and the electromagnetic wave emitted during the laser processing is taken out by the dichroic mirror to the outside of the optical axis of laser and is guided into a detector, when the condensing lens does not allow the electromagnetic wave to pass through, the electromagnetic wave can also be detected without the effect.

At this time, if a photosensor array is used as the detector or the condensing lens is placed between the dichroic mirror and the detector, the electromagnetic wave at each processing position can also be detected if laser processing is executed in scanning when the electromagnetic wave is detected not through the lens.

Further, to execute laser processing for making a hole in an insulating layer, change in a signal emitted from the treatment layer of the printed wiring board is measured to determine the remaining state of the insulating layer and when the remaining thickness of the insulating layer is larger than a setup value, if an additional pulse of processing laser is applied, laser processing can be executed automatically until the remaining thickness of the insulating layer becomes reliably thin, and failures can be eliminated.

What is claimed is:

1. A method for processing a printed wiring board in which the printed wiring board has a hole for electrically connecting an upper conductor layer of an insulating layer of a printed wiring board and a lower conductor layer of the insulating layer in the insulating layer to expose the lower conductor layer to a hole bottom, comprising the steps of:

forming a treatment layer arranged between the lower conductor layer and the insulating layer, the treatment layer emitting an electromagnetic wave having a wavelength different from that of a processing laser during laser processing; and measuring a change in a signal emitted from the treatment layer of the printed wiring board to judge a remaining state of the insulating layer on the lower conductor layer when laser processing is executed for forming the hole in the insulating layer.

2. The processing method as claimed in claim 1 wherein the treatment layer is provided by oxidizing a surface of the lower conductor layer.

3. The processing method as claimed in claim 1 wherein the treatment layer is provided by placing a conductive material for emitting an electromagnetic wave by laser processing on a surface of the lower conductor layer.

4. The processing method as claimed in claim 1 wherein the treatment layer is provided by placing a resin containing a component having a predetermined strength of emitting an electromagnetic wave by laser processing on a surface of the lower conductor layer.

5. The processing method as claimed in claim 1 further comprising the step of:

applying examination illumination to the hole and detecting signal change of the electromagnetic wave emitted from the treatment layer during the laser processing simultaneously measuring one of the strength of the reflected light from the lower conductor layer and the emitted light from the treatment layer to judge the remaining state of the insulating layer.

6. The processing method as claimed in claim 1 wherein the insulating layer is made of a resin for shielding the electromagnetic wave emitted from the treatment layer.

7. The processing method as claimed in claim 1 further comprising the steps of:

measuring the peak strength of the electromagnetic wave emitted from the treatment layer during the laser processing; and comparing the measured peak strength with a preset reference value to detect the remaining resin thickness on the lower conductor layer.

8. The processing method as claimed in claim 1 further comprising:

measuring the peak strength of the electromagnetic wave emitted from the treatment layer during laser processing decreasing the peak strength of the electromagnetic wave below a preset lower limit reference value after exceeding measured peak strength to a preset upper limit reference value to detect the remaining resin thickness on the lower conductor layer.

9. The processing method as claimed in claim 1 further comprising:

measuring the reflection of laser and the electromagnetic wave emitted from the treatment layer at the same time during the laser processing;

detecting the remaining resin thickness on the lower conductor layer on the basis of the fact that the reflection of laser strength becomes equal to or greater than a reference value of laser reflection and the electromagnetic wave strength becomes equal to or less than an emission strength reference value.

10. The processing method as claimed in claim 1 further comprising:
   measuring the electromagnetic wave emitted from the treatment layer during laser processing; and
   detecting a peak during the signal waveform is attenuated during the termination of laser irradiation to detect the remaining resin thickness on the lower conductor layer.

11. The processing method as claimed in claim 1 further comprising the steps of:
   measuring the strength of the electromagnetic wave emitted from the treatment layer during the laser processing;
   calculating the integration value of the emission strength for each hole; and
   comparing the integration value with a preset reference value to detect the remaining resin thickness on the lower conductor layer.

12. The processing method as claimed in claim 2 to 4 wherein the electromagnetic waves, having a wavelength ranging from 500 nm to 2000 nm, emitted from the treatment layer during laser processing are measured.

13. The processing method as claimed in claim 4 wherein the thickness of the treatment layer is set equal to or less than the thickness of the resin that can be removed by executing chemical etching of a next process and when a signal of the electromagnetic wave emitted from the treatment layer is measured, the laser processing is stopped.

14. The processing method as claimed in claim 1 wherein the treatment layer has the emission strength of the electromagnetic wave emitted during the laser processing twice or more as large as that of the electromagnetic wave emitted by the insulating layer during the laser processing of the insulating layer is used.

15. The processing method as claimed in claim 1 wherein the treatment layer has the emission strength on a specific wavelength of the electromagnetic wave emitted during the laser processing being twice or more as large as that on the specific wavelength of the electromagnetic wave emitted by the insulating layer during the laser processing of the insulating layer is used.

16. The processing method as claimed in claim 1 further comprising:
   measuring an electromagnetic wave on the wavelength at which the maximum strength of the electromagnetic wave emitted by the treatment layer during the laser processing thereof
   measuring on the wavelength at which the strength of the electromagnetic wave emitted by the treatment layer during the laser processing within a first range and the strength of the electromagnetic wave emitted by the insulating layer during the laser processing thereof within a second range larger than the first range
   judging the remaining state of the insulating layer on the basis of the electromagnetic wave strength on both the wavelengths.

17. The processing method as claimed in claim 1 further comprising:
   measuring the electromagnetic wave emitted by the treatment layer during the laser processing on a plurality of wavelengths to detect the remaining state of the insulating layer on the basis of the peak strength ratio on the wavelengths.

18. The processing method as claimed in claim 16 or 17 wherein the electromagnetic wave emitted during the laser processing is split by a spectroscope and the post-split electromagnetic waves are detected using two or more detectors.

19. The processing method as claimed in claim 1 wherein a dichroic mirror is placed between a lens and the printed wiring board and the electromagnetic wave emitted during the laser processing is taken out by the dichroic mirror to the outside of the optical axis of laser and is guided into a detector.

20. The processing method as claimed in claim 19 wherein a photosensor array is used as the detector.

21. The processing method as claimed in claim 19 wherein the condensing lens is placed between the dichroic mirror and the detector.

22. A method for forming a hole in an insulating layer of the printed wiring board by laser comprising the steps of:
   measuring a change in an electromagnetic wave emitted from a treatment layer of the printed wiring board; and
   judging a remaining state of the insulating layer on the basis of the change, if the remaining thickness of the insulating layer is larger than a set up value, an additional pulse of laser is applied.

23. The method for forming a hole in an insulating layer of printed wiring board by laser comprising steps of:
   measuring a change in a electromagnetic wave emitted from a treatment layer of the printed wiring board;
   simultaneously judging a remaining state of the insulating layer on the basis of the change;
   adjusting number of laser shots on the basis of the remaining state of the insulating layer; and
   confirming the remaining stage within the predetermined condition to complete each hole forming processing.

24. The method for forming a hole in an insulating layer of printed wiring board by laser as claimed in claim 23, wherein if the remaining thickness of the insulating layer is larger than the preset thickness, an additional laser shot is applied to the insulating layer even if after terminating the application of predetermined number of laser shots, and if the remaining thickness is equal or smaller than the preset thickness, the laser shot application is terminated even if before terminating a predetermined number of laser shots.

25. The method for forming a hole in an insulating layer of printed wiring board by laser as claimed in claim 24, wherein an energy of the laser shot is adjustable.

* * * * *

UNITED STATES PATENT AND TRADEMARK OFFICE
CERTIFICATE OF CORRECTION

PATENT NO. : 6,414,263 B1
DATED : July 2, 2002
INVENTOR(S) : Uchida et al.

It is certified that error appears in the above-identified patent and that said Letters Patent is hereby corrected as shown below:

<u>Title page,</u>
Item [73], should read:
-- [73] Assignees: Matsushita Electric Works, Ltd.,
Kadoma; Isamu Miyamoto,
Nishinomiya, both of (JP) --

Signed and Sealed this

Fourteenth Day of January, 2003

JAMES E. ROGAN
*Director of the United States Patent and Trademark Office*